United States Patent
Bae et al.

(10) Patent No.: US 11,536,775 B2
(45) Date of Patent: Dec. 27, 2022

(54) BATTERY LIFETIME PREDICTING SYSTEM USING CHARGE-DISCHARGE CHARACTERISTICS OF BATTERY FOR BMS SYSTEM

(71) Applicant: NASAN ELECTRIC INDUSTRIES CO., LTD., Changwon-si (KR)

(72) Inventors: Jong Hoon Bae, Changwon-si (KR); Su Hyeon Son, Changwon-si (KR); Seong Yong Kim, Changwon-si (KR); Sung Chun Moon, Gimhae-si (KR); Han Yeul An, Gimhae-si (KR); Kyung Jin Bae, Changwon-si (KR)

(73) Assignee: NASAN ELECTRIC INDUSTRIES CO., LTD., Changwon-si (KR)

( * ) Notice: Subject to any disclaimer, the term of this patent is extended or adjusted under 35 U.S.C. 154(b) by 46 days.

(21) Appl. No.: 17/251,342

(22) PCT Filed: Dec. 7, 2020

(86) PCT No.: PCT/KR2020/017774
§ 371 (c)(1),
(2) Date: Dec. 11, 2020

(87) PCT Pub. No.: WO2021/241826
PCT Pub. Date: Dec. 2, 2021

(65) Prior Publication Data
US 2022/0187384 A1 Jun. 16, 2022

(30) Foreign Application Priority Data
May 26, 2020 (KR) .................. 10-2020-0063029

(51) Int. Cl.
*G01R 31/392* (2019.01)
*G01R 31/3835* (2019.01)
(Continued)

(52) U.S. Cl.
CPC ....... *G01R 31/392* (2019.01); *G01R 31/3648* (2013.01); *G01R 31/3835* (2019.01); *H01M 10/44* (2013.01); *H01M 2010/4271* (2013.01)

(58) Field of Classification Search
CPC .............. G01R 31/392; G01R 31/3648; G01R 31/3835; H01M 10/44; H01M 2010/4271
See application file for complete search history.

(56) References Cited

U.S. PATENT DOCUMENTS

2020/0341064 A1* 10/2020 Miftahullatif ........ G01R 31/382

FOREIGN PATENT DOCUMENTS

EP 2713433 * 4/2014

OTHER PUBLICATIONS

Kim et al., "Novel Practical Life Cycle Prediction Method by Entropy Estimation of Li-Ion Battery", Electronics, 10 487, (2021).*
(Continued)

*Primary Examiner* — Catherine T. Rastovski
(74) *Attorney, Agent, or Firm* — NSIP Law

(57) ABSTRACT

Disclosed is a system for predicting the lifetime of a battery being chargeable and dischargeable using charge-discharge characteristics in a Battery Management System (BMS). The system includes: a battery state measurement unit measuring a voltage, a State of Charge (SOC), and a Depth of Discharge (DOD) of a battery while charging and discharging the battery with changing charge current and discharge current; an irreversible energy amount deriving unit deriving an irreversible energy amount ($Q_{ir}$) that is generated when the battery is charged/discharged from the voltage and the SOC using enthalpy and entropy theory; and a remaining lifetime prediction unit predicting a remaining lifetime of the battery from the derived irreversible energy amount ($Q_{ir}$), in which the remaining lifetime of the battery is predicted by equation
(Continued)

$$\frac{\sum_{k=1}^{n} Q_{ir\_k}}{\min\left(mQ_{ir\_m} \cdot \sum_{k=1}^{n} Q_{ir\_k}\right)} = \frac{N_a}{N_p}.$$

According to the present disclosure, the voltage/SOC relationship is examined clearly in terms of entropy and influence by temperature is expressed as V/SOC result, whereby it is possible to estimate the lifetime of a battery without temperature and temporal components.

5 Claims, 14 Drawing Sheets

(51) Int. Cl.
  *G01R 31/36* (2020.01)
  *H01M 10/44* (2006.01)
  *H01M 10/42* (2006.01)

(56) References Cited

OTHER PUBLICATIONS

Omariba et al., "Review of Battery Cell Balancing Methodologies for Optimizing Battery Pack Performance in Electric Vehicles" IEEE Access, vol. 7, (2019).*
Esmaeili et al., "Modeling the heat of mixing of LiMn2O4 pouch type battery", The 4th Iranian Conference on Renewable Energy and Distributed Generation, Mar. 2-3, 2016, Iran, Mashhad.*

* cited by examiner (a)

(b)

BATTERY LIFETIME PREDICTING SYSTEM USING CHARGE-DISCHARGE CHARACTERISTICS OF BATTERY FOR BMS SYSTEM

CROSS REFERENCE TO RELATED APPLICATIONS

This application is a U.S. National Stage Application of International Application No. PCT/KR2020/017774, filed on Dec. 7, 2020, which claims the benefit under 35 USC 119(a) and 365(b) of Korean Patent Application No. 10-2020-0063029, filed on May 26, 2020, filed on May 26, 2020 in the Korean Intellectual Property Office, the entire disclosure of which is incorporated herein by reference.

TECHNICAL FIELD

The present disclosure relates to management of a battery, particularly a system for predicting a battery lifetime using the charge-discharge characteristics of a battery in a BMS system.

BACKGROUND ART

A lithium-ion battery shows the most excellent performance among secondary batteries that are generally used at present. Since the lithium-ion battery is relatively light and has high energy density in comparison to other secondary batteries, the lithium-ion battery is widely used in various fields including portable products and even large energy storage systems. In particular, with the spread of electrical vehicles, next-generation batteries such as a lithium-sulfur battery, a lithium-air battery, a sodium-magnesium battery, and a solid-state battery are developed to solve the problem with the capacity of a battery for improving mileage and the problem with stability that is a mortal defect. However, there are still many problems in order to generally use such next-generation batteries. Accordingly, the market of lithium-ion battery is expected to expand. In particular, efficient energy use and the problem with stability of the lithium-ion battery are being more spotlighted with the growth of the market of mobile phone and personal mobility (an electric scooter, an electric bicycle, etc.).

In general, the lithium-ion battery is stable for a while in the early stage. However, as the frequency of use increases, the lifetime decreases, the electrolyte is decomposed by an oxidation-reduction reaction and forms a Solid Electrolyte Interface (SEI) layer, which causes the effect of increasing the internal resistance, and the available capacity of the battery decreases. The SEI layer serves as a protective membrane preventing continuous decomposition of the electrolyte, but is a direct reason that causes reduction of irreversible capacity in terms of entropy.

When charge and discharge are repeated with the lifetime reduced, problems such as overcharge, overdischarge, and overcurrent may be generated, depending on circumstances. In particular, with the growth of the market of person mobility, users charge electric scooters, electric bicycles, etc. at home, but fire accidents frequently occur due to overheating and ignition when they charge such devices without considering the lifetime.

When the capacity of the lithium-ion battery drops to 80% or lower from the initial capacity, the lifetime is considered end. It is very important to predict the lifetime of a battery for efficient use of resources and stable management and use of an energy storage system.

Many studies for predicting a lifetime has been conducted.

A "Life prediction apparatus and the life prediction method using the same" has been disclosed in Korean Patent Application Publication No. 10-2010-0019660 (Feb. 19, 2010). The apparatus and system for life prediction of a secondary battery on the basis of a constant voltage period when the battery is charged include: primarily charging a secondary battery within the operation voltage range of the secondary battery; cutting-off when the secondary battery is charged at a specific level of capacity; secondarily charging the battery until a current of specific capacity is reached when the cut-off voltage is reached; measuring the time until the current is reached in the secondary charging; predicting the lifetime of the battery by mapping data of the measurement time and a predetermined reference time; and displaying the predicted lifetime. According to this related art, since a user can check the lifetime of a secondary battery, it is possible to remove the inconvenience that the user cannot use a portable electric device due to discharge of the secondary battery at unexpected time. In particular, it is possible to solve the problem that a user unnecessarily charges the secondary battery without knowing the fact before charging the battery through a charger even when a secondary battery should be replaced.

However, since most devices in the related art use parameters including a time function, there is a defect that the devices cannot cope with use environments that may change at any time. Further, parameters and model estimation device based on temperature (T) cause errors in analysis of the state of a battery due to errors based on boundary conditions, temperature measurement errors, and a slow dynamic characteristic of a temperature change.

Accordingly, there is a strong need for a technology that can accurately predict the remaining lifetime of a battery without uncertain factors.

CITATION LIST

Patent Literature

[Patent Literature 1]
Korean Patent Application Publication No. 10-2010-0019660 (2010.02.19.), titled "Life prediction apparatus and the life prediction method using the same"

SUMMARY OF INVENTION

Technical Problem

An objective of the present disclosure is to provide a prediction system that can predict a battery lifetime in terms of entropy on the basis of not temporal factors, but a voltage/SOC relationship in a battery management system.

Solution to Problem

In order to achieve the objectives of the present disclosure, the present disclosure provides a system for predicting the lifetime of a battery being chargeable and dischargeable using charge-discharge characteristics in a BMS. The battery lifetime predicting system includes: a battery state measurement unit measuring a voltage, a State of Charge (SOC), and a Depth of Discharge (DOD) of a battery while charging and discharging the battery with changing charge current and discharge current; an irreversible energy amount deriving unit deriving an irreversible energy amount ($Q_{ir}$) that is generated when the battery is charged/discharged from the voltage and the SOC using enthalpy and entropy theory; and a remaining lifetime prediction unit predicting a remaining lifetime of the battery from the derived irreversible energy amount ($Q_{ir}$). In particular, the irreversible energy amount deriving unit derives the irreversible energy amount ($Q_{ir}$) using equation $$\frac{Q_{ir}}{Q_0} = \int (\alpha E_C - E_D) dSOC,$$

where $Q_0$ is the maximum capacity of the battery, a is an Arrhenius rate constant, and $E_C$ and $E_D$ are cell voltages at charging and discharging, respectively. Further, the remaining lifetime prediction unit predicts the remaining lifetime of the battery using equation $$\frac{\sum_{k=1}^{n} Q_{ir\_k}}{\min\left(m Q_{ir\_m} \cdot \sum_{k=1}^{n} Q_{ir\_k}\right)} = \frac{N_a}{N_p},$$

where $Q_{ir\_m}$ is the maximum value of the irreversible energy amount at each cycle, m is the maximum cycle period, $N_a$ and $N_p$ are the actual number of times of cycles and the predicted number of times of cycles, respectively, and $Q_{ir\_k}$ is the current irreversible energy amount at a k-th cycle. In particular, the remaining lifetime prediction unit obtains $Q_{ir\_m}$ and $Q_{ir\_k}$ from the area of a charge/discharge curve at each cycle in a graph showing the relationship between voltage and an SOC of the battery, and the area of the charge/discharge curve at each cycle is obtained by dividing the charge/discharge curve into at least two or more sections and summing up areas of the divided sections. Further, the dividing of the charge/discharge curve at each cycle includes: extracting charging start points ($P_{CS}$, $P^*_{CS}$), charging knee points ($P_{CK}$, $P^*_{CK}$), discharging start points ($P_{DS}$, $P^*_{DS}$), and discharging knee points ($P_{DK}$, $P^*_{DK}$) at two continuous cycles in the charge/discharge curve; and dividing the charge/discharge curve into: a first section formed by $P_{CS}$, $P^*_{CS}$, $P_{CK}$, and $P^*_{CK}$; a second section formed by $_{CS}$, $P^*_{CK}$, $P^*_{DS}$, and $P^*_{DK}$; and a third section formed by $P_{DS}$, $P^*_{DS}$, $P_{CK}$, and $P^*_{DK}$. Further, the charging start points ($P_{CS}$) and the discharging start points ($P_{DS}$) are extracted by a change of a current direction, and the charging knee points ($P_{CK}$) and the discharging knee points ($P_{DK}$) are extracted on the basis of the amount of a change of voltage for the SOC.

Advantageous Effects of Invention

According to the present disclosure, in order to remove temporal factors in consideration of the actual configuration of a battery management system, the voltage/SOC relationship is examined clearly in terms of entropy and influence by temperature is expressed as V/SOC result, whereby it is possible to estimate the lifetime of a battery without temperature and time components.

DESCRIPTION OF EMBODIMENTS

Figure 1A:
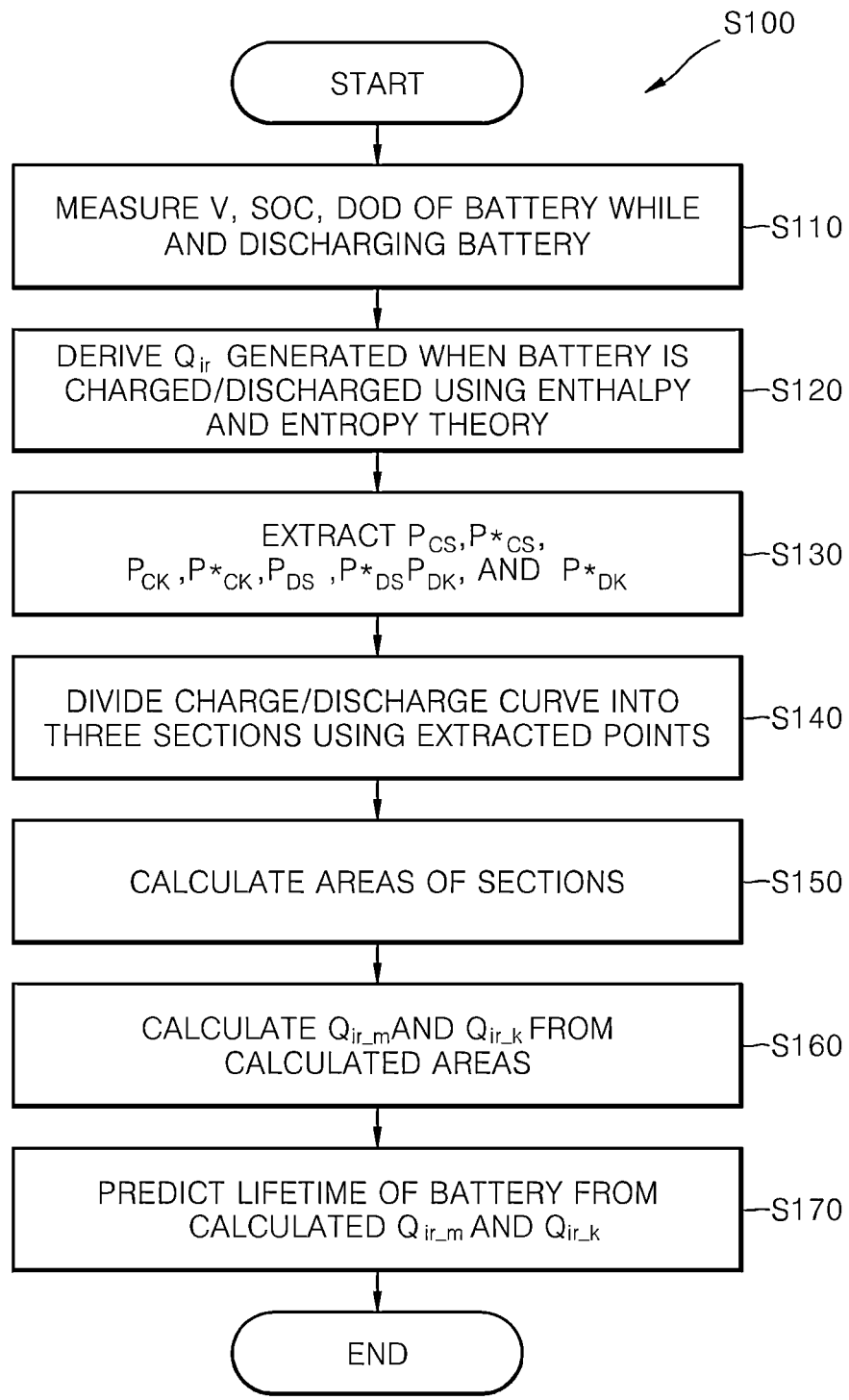
FIG. 1A is a flowchart schematically showing a method of predicting a battery lifetime based on entropy-enthalpy.

It is required to refer to the accompanying drawings exemplifying preferred embodiments of the present disclosure and the contents in the accompanying drawings to help sufficiently understand the present disclosure, the operational advantages of the present disclosure, and the objects that are achieved by implementing the present disclosure.

The present disclosure will be described hereafter in detail by describing exemplary embodiments of the present disclosure with reference to the accompanying drawings. However, the present disclosure may be modified in various different ways and is not limited to the embodiments described herein. Parts that are not related to the description are omitted to make the present disclosure clear, and the same components are given the same reference numerals.

Figure 1B:
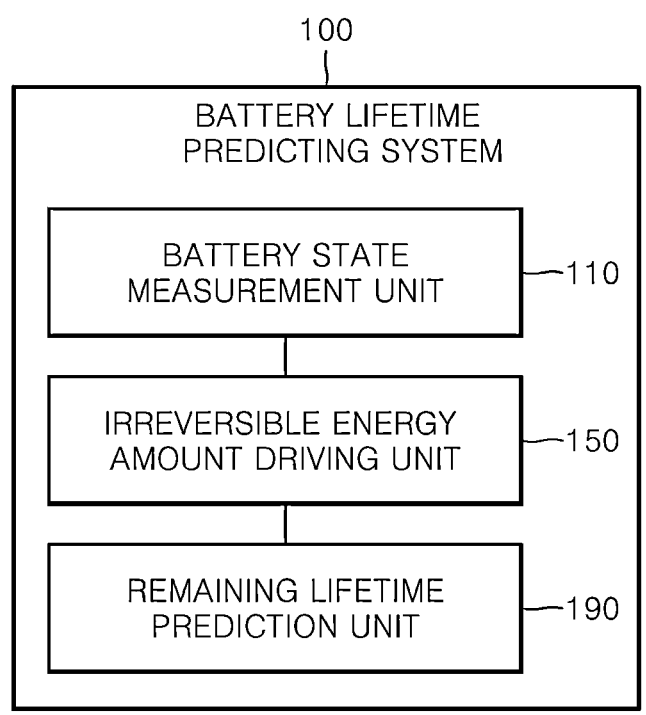
FIG. 1B is a block diagram schematically showing a battery lifetime predicting system performing the method of predicting a battery lifetime of FIG. 1A.

FIG. 1A is a flowchart schematically showing a method S100 of predicting a battery lifetime based on entropy-enthalpy, and FIG. 1B is a block diagram schematically showing a battery lifetime predicting system 100 performing the method of predicting a battery lifetime of FIG. 1A.

It is important to quantify heat generation and a temperature change on the basis of the C-rate of charge/discharge in order to set optimal operation conditions for the performance of a battery such as the lifetime and safety of the battery. A method of predicting a battery lifetime considering time parameters is briefly described for the convenience of understanding.

Characteristic equations for charge/discharge voltages of a battery can be expressed as follows by a current term, a temperature (T), and parameters related to an SOH on the basis of Shepherd model.

$$E_t = E_0 - R_i \cdot I - K \frac{Q_t}{I \cdot t^{-0.1} Q_t} \cdot I^* - K \frac{Q_t}{Q_t - I \cdot t} \cdot I \cdot t + A e^{-(B \cdot I \cdot t)} \quad \text{[Equation 1]}$$

($I^* < 0$: Charging)

$$E_t = E_0 - R_i \cdot I - K \frac{Q_t}{Q_t - I \cdot t} \cdot I^* - K \frac{Q_t}{Q_t - I \cdot t} \cdot I \cdot t + A e^{-(B \cdot I \cdot t)} \quad \text{[Equation 2]}$$

($I^* < 0$: Charging)

The above formulae are voltage characteristic equations for battery analysis and have been proposed as fundamental models by many researchers. However, in this case, even if the current is analyzed as a constant current that is operated in a Constant Current (CC) mode, $E_0$, $R_i$, K, $Q_t$ are functions that can be expressed as following equations in accordance with temperature and an SOC, so it is difficult to analyze the characteristics of a battery on the basis of only Equations 1 and 2.

$$E_0 = E_{0|T_n} + \frac{\partial E}{\partial T}(T_i - T_n) \quad \text{[Equation 3]}$$

$$R_i = R_{i|T_n} \cdot \exp\left(\beta\left(\frac{1}{T_i} - \frac{1}{T_n}\right)\right) \quad \text{[Equation 4]}$$

$$K = K_{|T_n} \cdot \exp\left(\alpha\left(\frac{1}{T_i} - \frac{1}{T_n}\right)\right) \quad \text{[Equation 5]}$$

$$Q_0 = Q_{0|T_n} + \frac{\Delta Q_0}{\Delta T}(T_a - T_n) \quad \text{[Equation 6]}$$

Since the above formulae are calculated as functions of time, there is a high possibility that many errors may be caused due to changes in use pattern, load environment, etc. of a battery, so it may be a nonrealistic analysis apparatus. Estimating internal resistance, polarization resistance, capacity, etc. considering thermal factors that are analyzed in many studies actually includes many error factors, so it is limited to actually use them to an apparatus.

In order to prevent these problems, a method of analyzing a state in which a current is '0', that is, a state by measuring OCV has been proposed, but stabilization takes a little time in order to measure OCV, so it is difficult to apply the method in real-time prediction.

First, a voltage, an SOC, a DOD, etc. of a battery are measured while the battery is charged/discharged (S110). This operation may be performed by a battery state measurement unit 110.

Considering the actual use environment, parameters that can be actually measured are voltage, current, and temperature. In this case, it is clear that temperature is an important parameter. A large-capacity application such as an ESS has cooling equipment for stable operation of a battery and operates a system controlling the surface temperature of the battery depending on temperature. However, most small-capacity systems do not have cooling equipment and maintain an appropriate I-rate, and temperature is limited only by protectors.

Considering heat transfer characteristics between the inside and the outside and the slow dynamic characteristics of measurement and response of a temperature sensor, when the equations are reflected in real-time calculation, there is a high possibility of errors in analysis of the state of a battery.

Mathematical Modeling for Lifetime Prediction

Accordingly, it is advantageous to predict a remaining lifetime of a battery using the concept of entropy and enthalpy without temporal factors as in Equations 1 to 6.

$$\Delta G(x) = -nFE_{OC}(x) = \Delta H(x) - T\Delta S(x) \quad \text{[Equation 7]}$$

Equation 7, which is a formula about Gibb's free energy ($\Delta G$), describes the concept of enthalpy ($\Delta H$) and entropy ($\Delta S$). In the equation, n is the number of electrons included in reaction, and as for lithium ion, n=1, and F is Faraday constant. Further, x is the density of lithium ion. As x is proportioned to an SOC, it can be expressed as Equation 8.

$$\Delta S(x) = F\left(\frac{\partial E_{OC}(x)}{\partial T}\right) = F\left(\frac{\partial E_{OC}}{\partial T}\right)_{SOC} \quad \text{[Equation 8]}$$

It can be defined as irreversible joule heat, reversible joule heat, and heat by terminal resistance as in Equation 9 on the basis of the above equation and entropy theory.

[Equation 9]

$$Q_{total} = Q_{irreversible} + Q_{reversible} + Q_{tab}$$
$$= I(E_{oc} - E_t) - IT\left(\frac{\partial E_{OC}}{\partial T}\right)_{SOC} + I^2(R_A(T) + R_S(T))$$

In [Equation 9], I is current, T is temperature, $R_A$ and $R_B$ are the resistances of terminal A and B, respectively, $E_{OC}$ is an open circuit voltage and $E_t$ is a voltage at time t. In this equation, the irreversible joule heat should be addressed. This is because, in a function related to temperature or internal resistance, there is a high possibility of errors due to a measurement or estimation error and a slow dynamic characteristic, as described above. Accordingly, it is preferable to use an irreversible energy amount expressed by terms of a voltage and a current that can be estimated in real time.

$$\dot{Q}_{irreversible} = \dot{Q}_{ir} = I(E_{OC} - E_t) \quad \text{[Equation 10]}$$

where $E_C$ is a cell voltage in charging and $E_D$ is a cell voltage at discharging. The total amount of irreversible heat can be expressed as follows by integrating Equation 10 (S120).

$$Q_{ir} = I\int (\alpha E_C - E_D) dt \quad \text{[Equation 11]}$$

$$SOC = \frac{Q_r \pm Q_t}{Q_a} = (Q_r \pm I \cdot t) Q_0^{-1} \quad \text{[Equation 12]}$$

$$dt = I^{-1} \cdot Q_0 dSOC \quad \text{[Equation 13]}$$

Equation 14 is obtained by multiplying both sides by $V_b$ and then expressing it in an integral formula.

$$\int V_b dt = I^{-1} \cdot Q_0 \int V_b dSOC \quad \text{[Equation 14]}$$

where $V_b$ is defined as $\alpha E_C - E_D$, and rearranging the equation, Equation 15 is obtained.

$$\frac{1}{Q_0} I \int (\alpha E_C - E_D) dt = \int (\alpha E_C - E_D) dSOC \quad \text{[Equation 15]}$$

Rearranging Equations 11 to 15, it can be seen that the total amount of a voltage change for an SOC can be derived into an equation that can obtain irreversible energy, as in Equation 16. This operation may be performed by an irreversible energy amount deriving unit 150.

$$\frac{Q_{ir}}{Q_0} = \int (\alpha E_C - E_0) dSOC \quad \text{\{Equation 16\}}$$

For each of charge/discharge cycles, the battery lifetime can be calculated by adding irreversible energy ($Q_{ir\_k}$) and comparing it with the product of the maximum amount ($Q_{ir\_m}$) of irreversible energy, which can be produced for one cycle, and the maximum cycle period.

Using Equation 17, a State of Life (SOL) of a battery can be estimated. Accordingly, a battery lifetime can be determined by calculating irreversible energy according to the corresponding charge/discharge.

In general, when the sum of irreversible energy according to charge/discharge is 80% or lower of the initial battery capacity on the basis of Equation 17, it is possible to determine that the lifetime of a battery is ended.

$$SOL = 1 - \frac{1}{mQ_{ir\_m}} \sum_{k=1}^{n} Q_{ir\_k} \quad \text{[Equation 17]}$$

The charge/discharge cycle provided by a battery manufacturer is the number of times when the DOC is 100%, so the charge/discharge cycle that can be substantially used can be calculated as follows. This operation may be performed by a remaining lifetime prediction unit 190.

$$\frac{\sum_{k=1}^{n} Q_{ir\_k}}{\min\left(mQ_{ir\_m} \cdot \sum_{k=1}^{n} Q_{ir\_k}\right)} = \frac{N_a}{N_p}. \quad \text{[Equation 18]}$$

After the irreversible energy amount ($Q_{ir}$) that is generated when a battery is charged/discharged is derived, charging start points ($P_{CS}$, $P^*_{CS}$), charging knee points ($P_{CK}$, $P^*_{CK}$), discharging start points ($P_{DS}$, $P^*DS$), and discharging knee points ($P_{DK}$, $P^*_{DK}$) two continuous cycles are extracted from a charge/discharge curve (S130), and the charge/discharge curve is divided into three sections using the extracted points (S140).

$Q_{ir\_m}$ and $Q_{ir\_k}$ are calculated by obtaining and summing up the areas of the sections. The remaining lifetime of the battery are predicted from the calculated $Q_{ir\_m}$ and $Q_{ir}\_k$ (S170). These processes will be described in detail the corresponding parts in the specification.

Configuration of Test System

Figure 2:
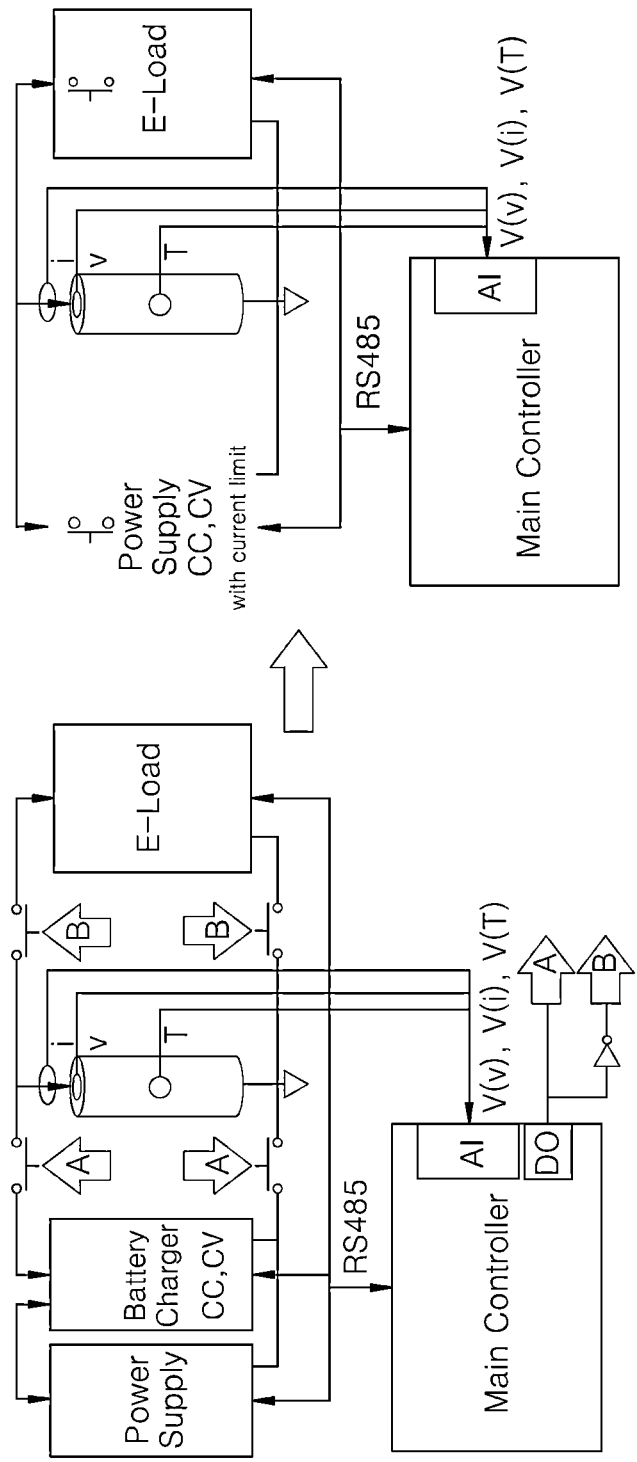
FIG. 2 is a view showing a simplified configuration of a battery test system.

FIG. 2 is a view showing a simplified configuration of a battery test system.

In order to examine the proposed method, a battery charge/discharge test system was configured as in picture 1. Although it is possible to turn on/off the test system in accordance with a charge/discharge sequence through a main controller using a battery-dedicated charger having constant current (CC) and constant voltage (CV) functions, the test system is more simply configured in consideration of the transition state, a loss, etc. of a switch. A CV operation was implemented using a power supply having a current limit function, and a charge/discharge sequence was configured to be controlled using serial communication without a switch. Temperature T was configured to act only to perform a protection function against an abnormal state.

The specifications of batteries used in a test are shown in Table 1. It should be noted that the specifications in Table 1 are only examples and are not intended to limit the present disclosure.

TABLE 1

| Parameter | Value | Parameter | Value |
| --- | --- | --- | --- |
| Standard discharge capacity, mAh | min 4,900 | Cycle life capacity at 500 cycles, mAh | ≥3,802 |
| rated discharge capacity, mAh | min 4,753 | Initial internal impedance | 28.0 |
| Charge voltage, V | 4.2 | Calculated internal impedance | 40.0 |
| Nominal voltage, V | 3.63 | Cell weight, g | 69.0 |
| Max. charge current, mA | 4,900 | Cell length, mm | 70.6 |
| Max. cont. discharge current, mA | 9,800 | Cell Diameter, mm | 21.1 |
| Discharge cut-off, V | 2.5 | Charge Method | CC-CV[1] |

A charge/discharge characteristic test was performed for a new battery and five kinds of batteries charged/discharged 100, 200, 300, 400, and 500 times, respectively, at a DOD of 100, a rated charge current (0.5 C), and a discharge current (1 C) in order to check characteristics in an aged state of batteries.

Figure 3A:
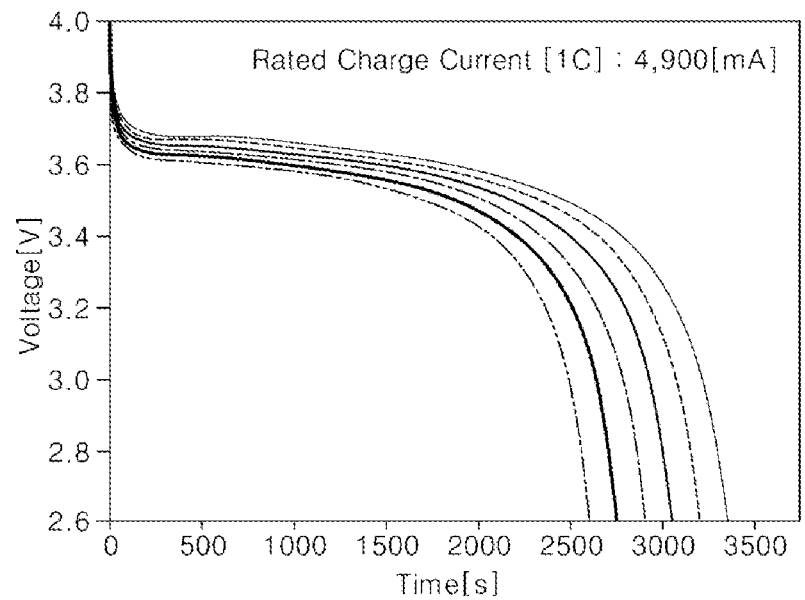
FIG. 3A is a discharge characteristic graph when batteries in different states were discharged at 1 C.
Figure 3B:
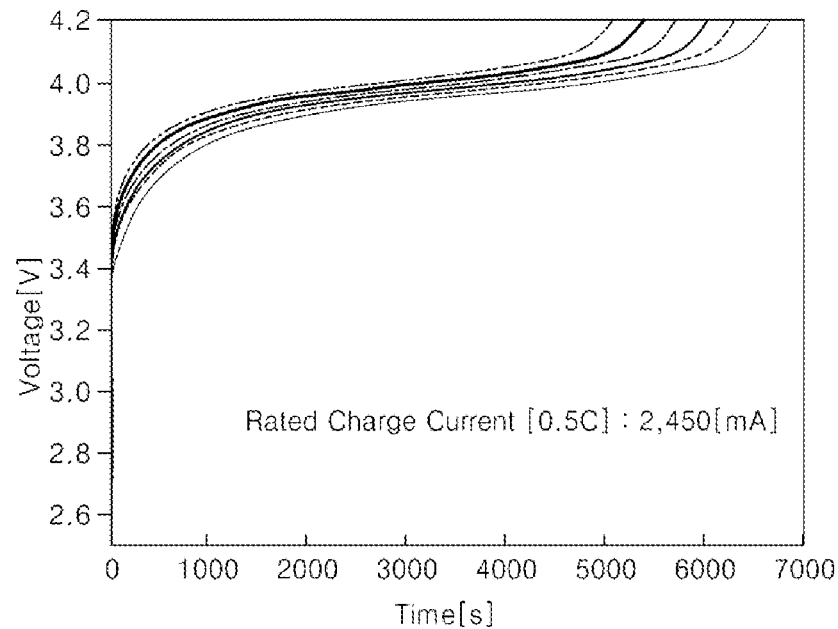
FIG. 3B shows charge characteristics when batteries in different states were charged at 0.5 C.

FIG. 3A is a discharge characteristic graph when batteries in different states were discharged at 1 C, and FIG. 3B shows charge characteristics when batteries in different states were charged at 0.5 C. As expected, it can be seen that the more the charge/discharge cycles, the quicker the charge and discharge speeds of batteries changed. It can be seen that because charge/discharge were performed regularly according to the rules for battery characteristics, the characteristics according to each aged state show a very linear change.

Figure 4A:
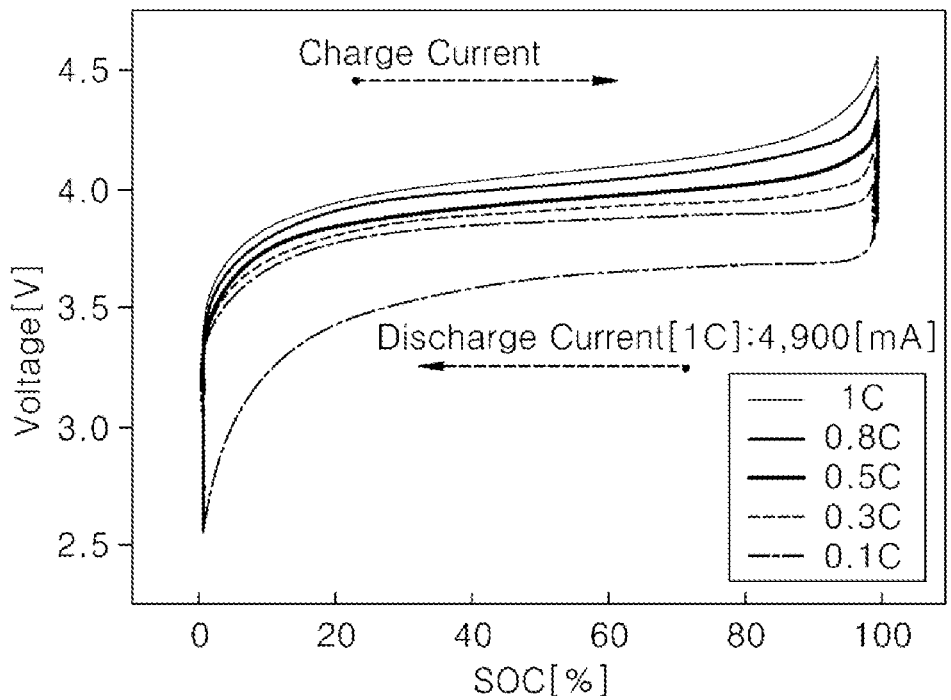
FIG. 4A is a voltage curve of an SOC when a charge current changes (discharge current fixed at 1 C).
Figure 4B:
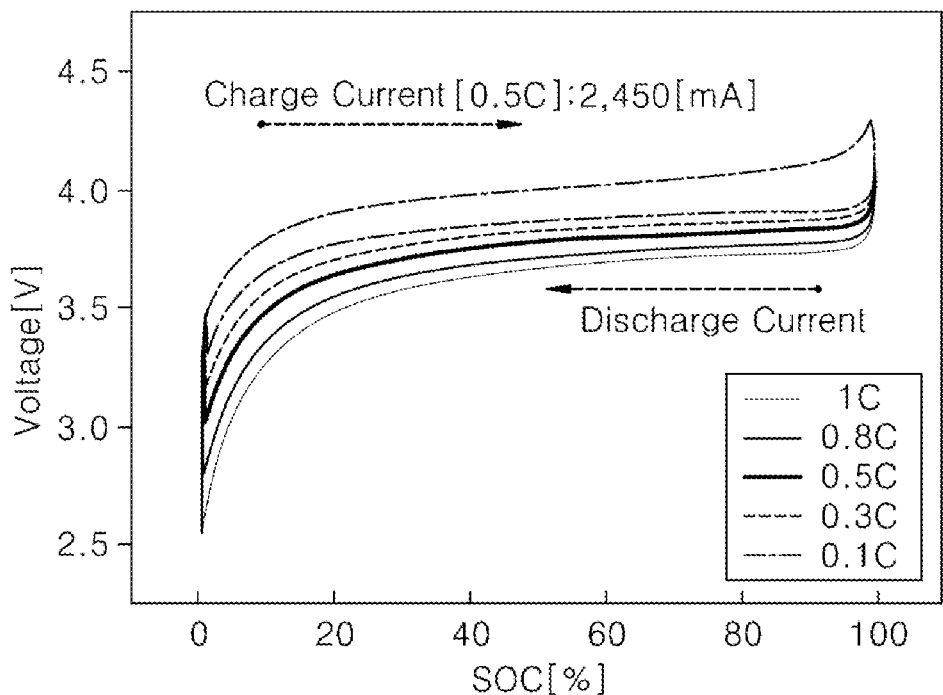
FIG. 4B is a voltage curve of an SOC when a discharge current changes (charge current fixed at 0.5 C).

FIG. 4A is a voltage curve of an SOC when a charge current changes (discharge current fixed at 1 C), and FIG. 4B is a voltage curve of an SOC when a discharge current changes (charge current fixed at 0.5 C).

That is, FIG. 4A is a graph of a voltage for an SOC when a discharge current was fixed at 1 C and a battery was charged/discharged at a DOD of 100% while a charge current was changed from 0.1 C to 1 C. It can be seen that the area of a curve constructed when charge/discharge is performed changes in accordance with the magnitude of the current. It can be seen that when the magnitude of the current is the largest at 1 C, the area is wide, and the smaller the charge current, the smaller the area. FIG. 4B is a graph of a voltage for an SOC when a discharge current was changed at a DOD of 100% with the charge current fixed at 0.5 C. It can be seen that when the discharge value is the largest at 1 C, the graph is constructed lowermost. It can be seen that the smaller the current, the smaller the area surrounded by a graph. It can be seen that the basis of the technology described above is made clear through FIGS. 4A and 4B. It can be seen that the area surrounded by the curve of a voltage for an SOC depends on the magnitude of a current, and it could be seen that the larger the current, the larger the area. This amount can be converted into irreversible energy, and accordingly, a lifetime can be estimated by calculating the irreversible energy.

Figure 5A:
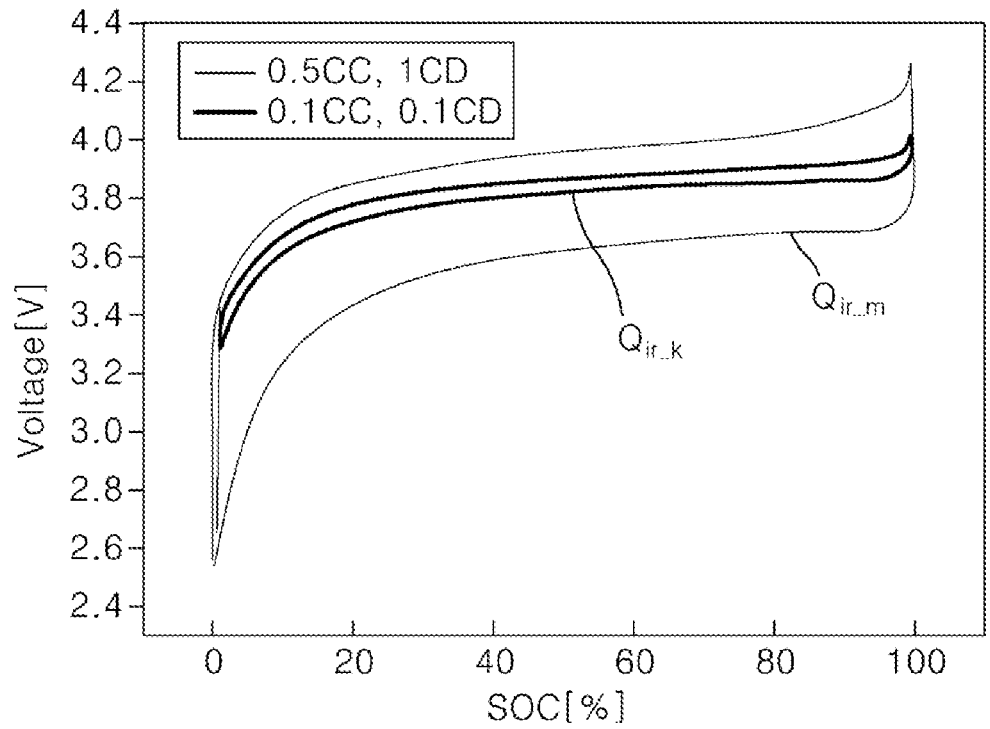
FIG. 5A shows changes of a Q value when only a charge-discharge current is different.
Figure 5B:
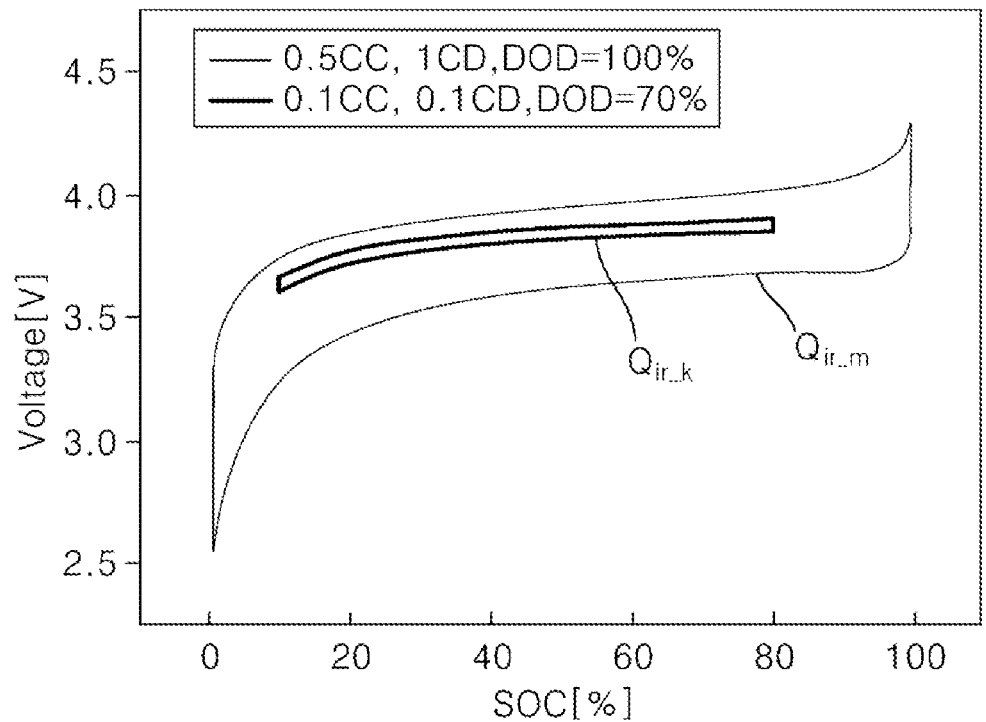
FIG. 5B shows changes of a Q value when a charge-discharge current and a DOD are different.

FIG. 5A shows changes of a Q value when only a charge/discharge current is different, and FIG. 5B shows changes of a Q value when a charge/discharge current and a DOD are different. In particular, FIG. 5A shows charge/ discharge characteristic curves when a DOD is 100% for 0.5 C Charging (0.5 CC), 1 C Discharging (1 CD) and 0.1 C Charging (0.1 CC), 0.1 C Discharging (0.1 CD). The area of the curve surrounded by the black solid line in FIG. 5A is defined as and when a battery was operated at a DOD of 100% in one cycle, the rated charge current and the rated discharge current are the maximum of irreversible heat capacity. The area indicated by a red solid line, which is the magnitude of irreversible heat capacity when a DOD is 100% for 0.1 C Charging (0.1 CC) and 0.1 C Discharging (0.1 CD), is defined as $Q_{ir\_k}$, and means the battery capacity reduced in specific one cycle. FIG. 5B shows capacity consumed when a battery was operated at a DOD of 70%. $Q_{ir\_m} - Q_{ir\_k}$ means available remaining capacity in FIGS. 5A and 5B. Accordingly, it is possible to calculate remaining capacity and remaining cycles through a proportional relation expression.

Figure 6:
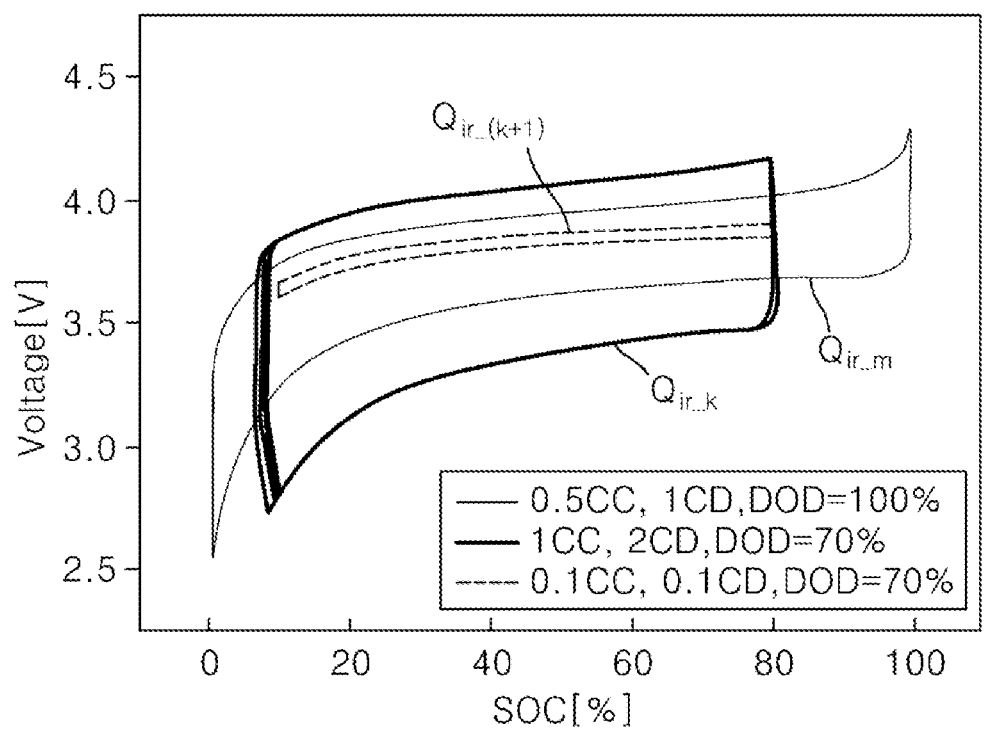
FIG. 6 shows irreversible energy in various situations.

FIG. 6 shows irreversible energy in various situations.

FIG. 6 is a resultant graph in which the magnitude of a charge/discharge current and a DOD are changed, in which the black solid line region is the maximum value $Q_{ir}$ m of irreversible energy for one cycle. FIG. 5 shows the shape of irreversible heat capacity that variously changes. When the charge speed of a current exceeds a rated range, the irreversible heat capacity exceeds the one-cycle reference value, whereby the lifetime decreases.

Figure 7A:
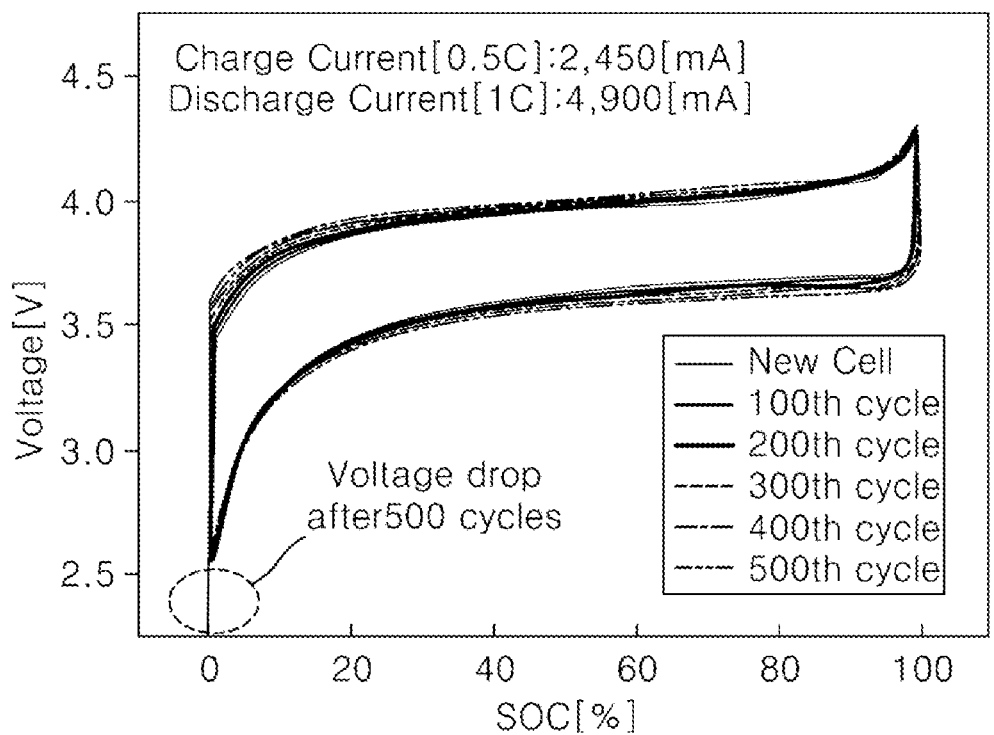
FIGS. 7A and 7B show a charge-discharge operation for a smaller current.
Figure 7B:
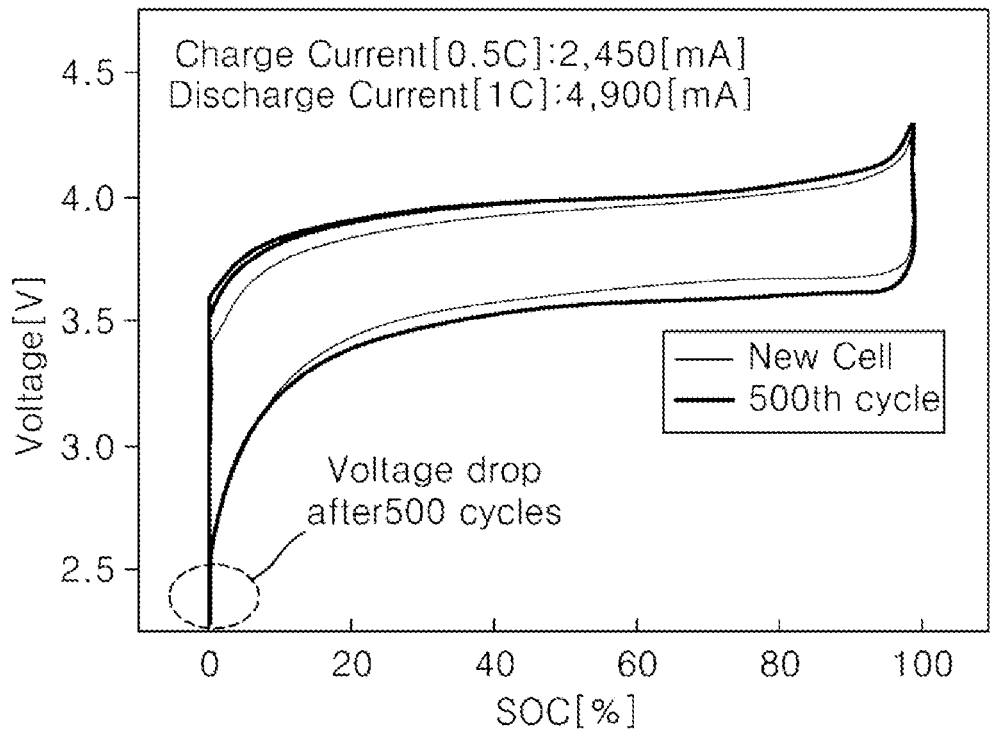

FIGS. 7A and 7B show a charge/discharge operation at a smaller current, that is, are resultant graphs obtained by changing the magnitude of a charge/discharge current and a DOD with respect to a reference. In this case, the irreversible energy decreases, so the remaining lifetime increases.

In detail, FIG. 7A shows the case when the charge current is 0.5 C and the discharge current is 1 C (0 to 500 cycles) and FIG. 7B shows the case when the discharge current is 0.5 C and the charge current is 1 C (a new battery and a battery at 500 times). That is, FIG. 7 shows comparison of characteristic curves when six batteries having different lifetimes were charged/discharged at 0.5 CC, 1 CD, and a DOD of 100%, in which it can be seen that, on the basis of areas, the area of the curve of the new battery is the widest, and the shorter the lifetime, the bigger the area of the curves. FIG. 7B shows characteristic curves of a new battery and a battery with a lifetime almost ended. As for the battery with a lifetime almost ended, it was found that a voltage drops when the battery is discharged until the SOC becomes 0%. In this case, it is expected that there is a high possibility of a problem with the battery to occur due to instantaneous transition.

Point Detection Method (PDM).

In general, a method of using an integrator is used to obtain the area of a curve. However, an integrator has a defect that a method of removing an accumulated error is required. Accordingly, the present disclosure employs a method of obtaining the area of a rectangle by detection four knee points without using an integrator. According to this method, it is possible to remove the defect of using an integrator, and to more simply and effectively obtain irreversible heat capacity.

Figure 8:
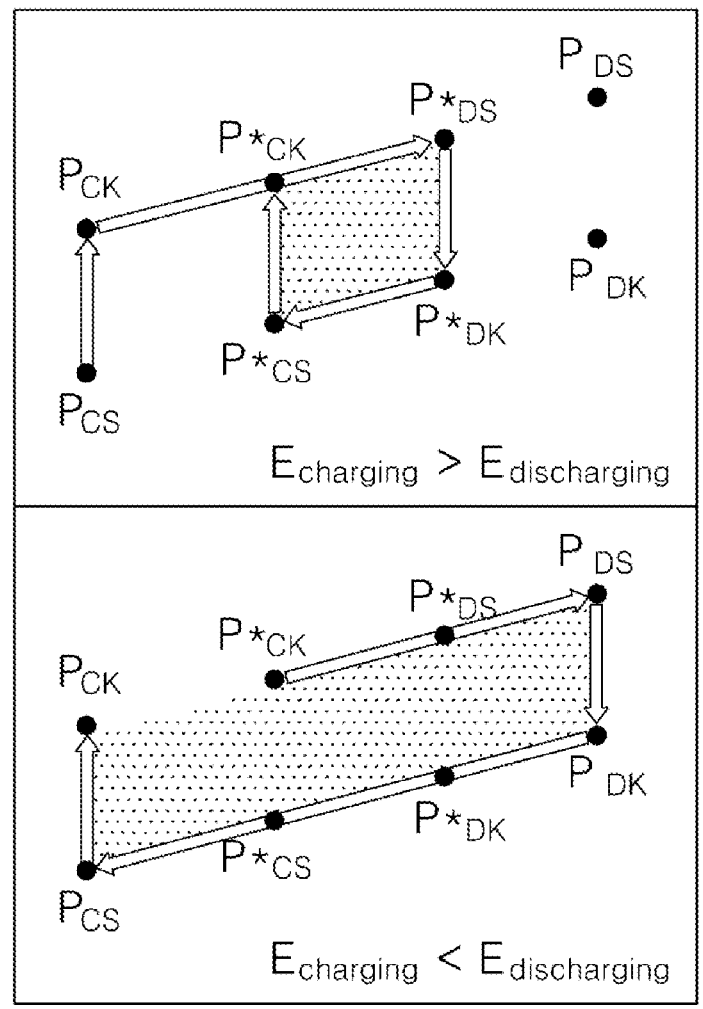
FIG. 8 shows the concept of a point detection method (PDM).

FIG. 8 shows the concept of a point detection method (PDM).

A change of a point is finally classified into a case when discharged energy is smaller than charged energy (FIG. 8A) and a case when discharged energy is larger than charged energy (FIG. 8B). In these cases, $P_{CS}$ is defined as a charging start point, $P_{CK}$ is defined as a charging knee point, $P_{DS}$ is defined as a discharging start point, and $P_{DK}$ is defined as a discharging knee point. Such changes of point have a total of four cases, which are shown in FIG. 9.

Figure 9:
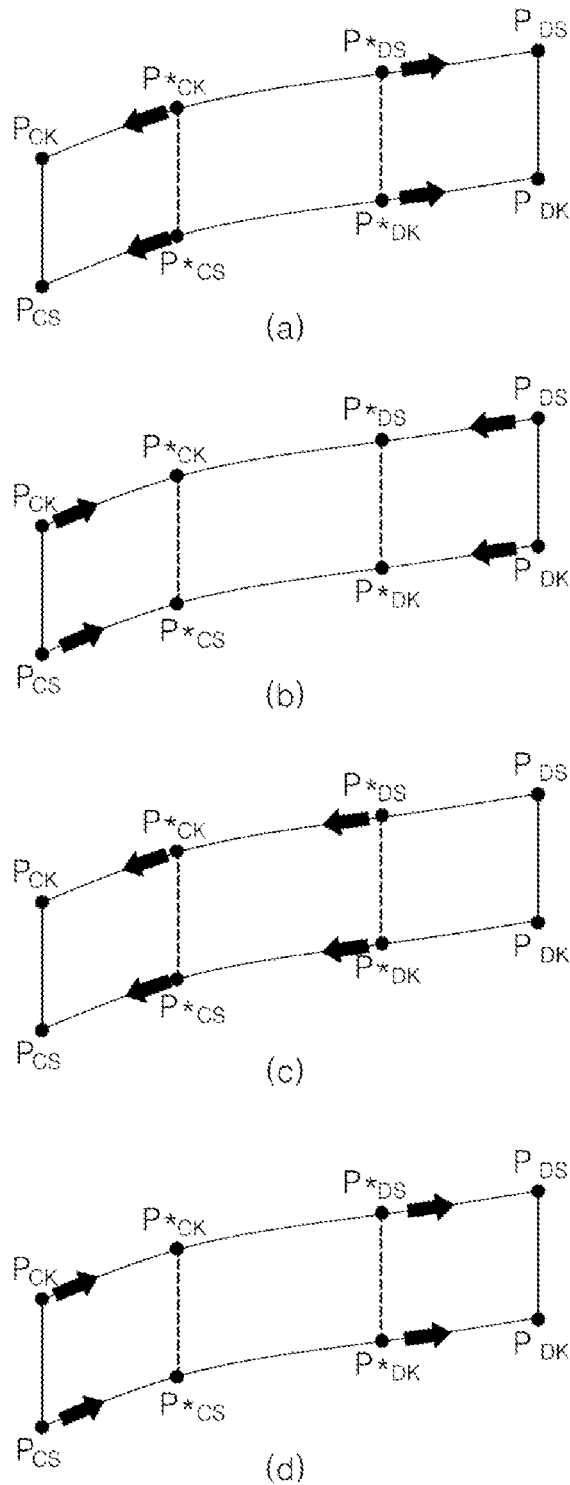
FIG. 9 shows four cases of a PDM according to charge/discharge states.

FIG. 9 shows four cases of a PDM according to charge states. In detail, (a) is a case when a DOD becomes wide, (b) is the case when a DOD becomes narrow, (c) is a case when a DOD range becomes low, and (d) is the case when a DOD range becomes high.

FIG. 9 can be expressed by a DOD. In the case (a), the range of a DOD is wider than before, and, in the case (b), the DOD range narrows. In the case (c), the DOD range moves, that is, the depth of discharge increases and the depth of charge decreases. When the depth of charge is also large, it is the case (a). That is, in contrast to (d), the depth of discharge decreases and the depth of charge increases. Similarly, when the depth of charge also decreases, it is the case (b). In general, almost all charge/discharge states of batteries are included in the above four cases. In FIG. 9, Ps ($P_{CS}$, $P_{CK}$, $P_{DS}$, $P_{DK}$) indicated in blue show the current positions and are the same as P(n−1) of discrete signal process components. The green points P* ($P^*_{CS}$, $P^*_{CK}$, $P^*_{DS}$, $P^*_{DK}$) with a superscript * are newly updated points, which are P(n) of discrete signal process components.

Section Separation Method (SSM)

Figure 10:
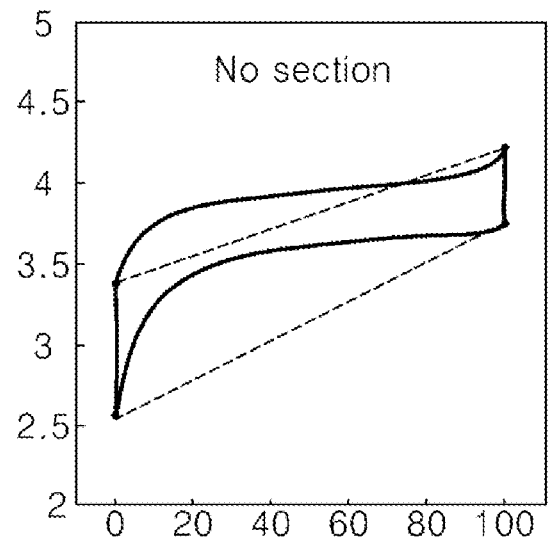
FIG. 10 shows the concept of applying a section separation apparatus.
Figure 10:
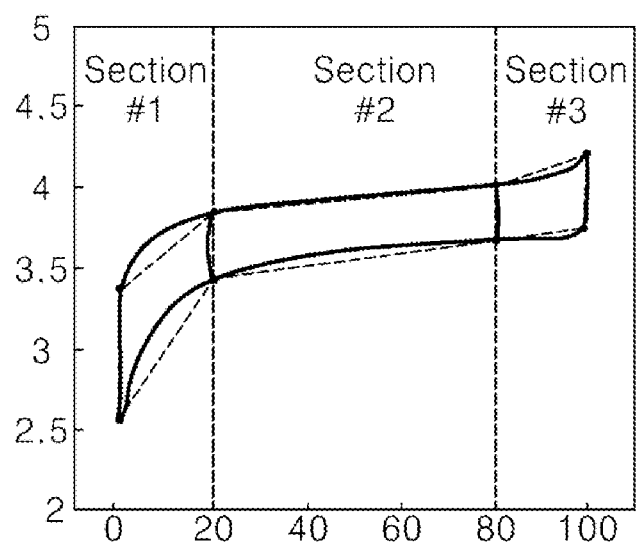

FIG. 10 shows the concept of applying a section separation method. In detail, (a) shows a Q value by a PDM when an SSM is not applied and (b) shows a Q value by a PDM when an SSM is applied.

It is possible to obtain an area using the PDM, but referring to the shape of the curves, when the DOD is large, an area calculation error is large, as shown in FIG. 10A. Obviously, considering the actual use period of most batteries is 20 to 80%, there is no large error because it is an almost constant section of a curve. However, considering the entire section of the SOC (0 to 100%), this method may be not a practical method. Accordingly, a method (SSM) dividing an area into three sections, as shown in FIG. 10B, is proposed. Table 2 shows error rates between the actual area of a curve and the area calculated by the PDM. It was found that when the SSM is not applied, the error rate is remarkably increased in the section with a large DOD.

TABLE 2

| DOD[%] | No Section[%] | 3 Section Separation [%] |
|---|---|---|
| 0-100 | <70 | >89 |
| 10-90 | >88 | >92 |
| 20-80 | >92 | >94 |

Algorithm

Figure 11:
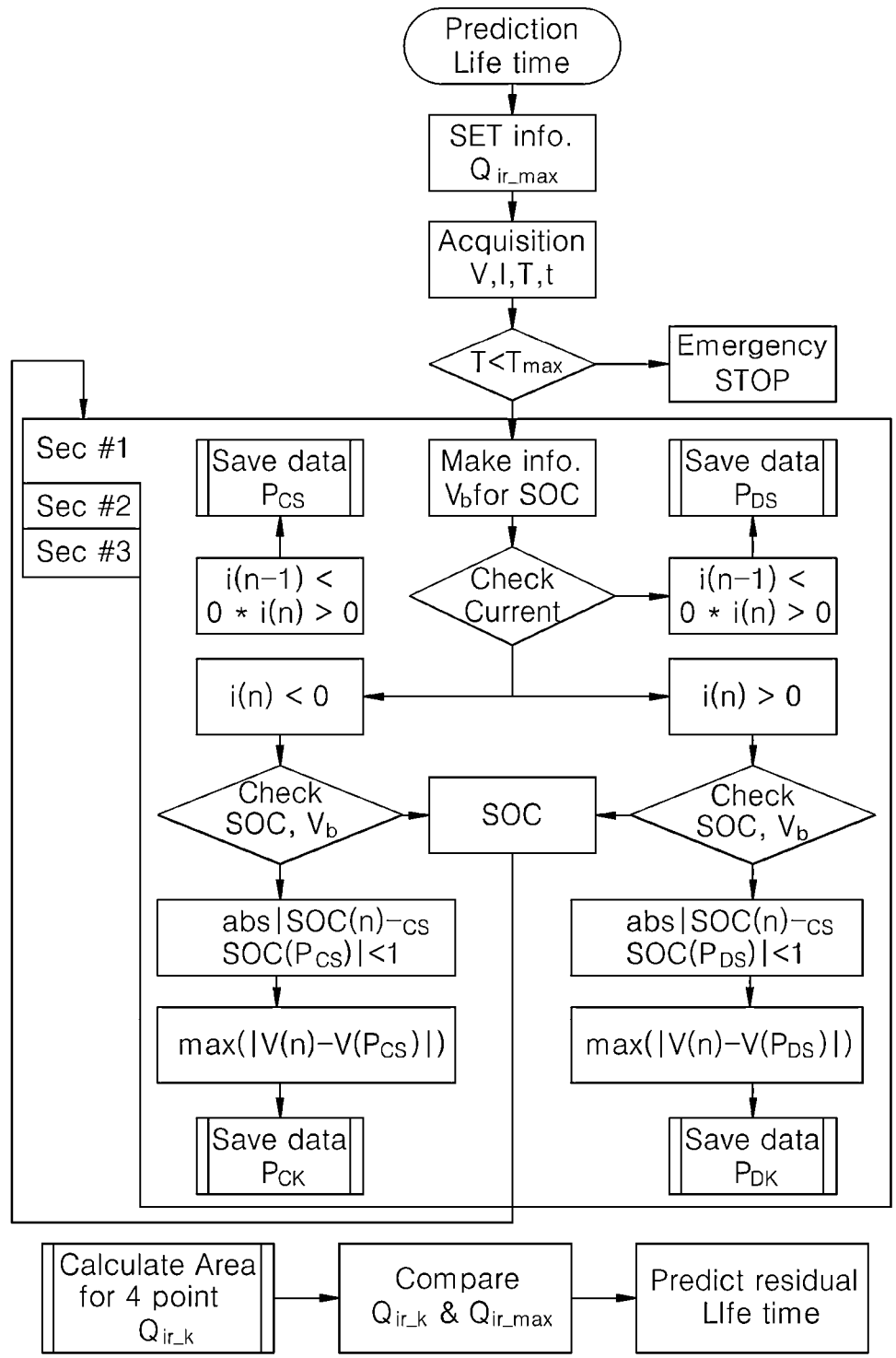
FIG. 11 schematically shows a pseudocode of an algorithm for predicting a battery lifetime.

FIG. 11 schematically shows a pseudocode of an algorithm for predicting a battery lifetime.

First, in order to determine information provided by the manufacturer is used or information is stored by performing a sample charge/discharge cycle. Thereafter, voltage, current, and temperature information is acquired in real time and is used to predict the lifetime. Temperature information is used as an emergency stop trigger for an abnormal situation.

Whether it is a charge state or a discharge state is examined first using the information. If the current direction is changed when the current information is checked, it is the information of the charging or discharging start point, and accordingly, it is stored as $P_{CS}$ and $P_{DS}$. Further, SOC information is examined during charge and discharge, respectively. When the SOC at the beginning of charge or discharge changes over 1%, the corresponding point is stored as a knee point and the voltage information at the knee point is stored in $P_{CK}$ or $P_{DK}$. It should be noted that the amount of change is an example and is not intended to limit the present disclosure.

It is possible to find out four points in this way, the same operation is performed in three sections, it is used to calculate the value corresponding to irreversible energy in one cycle, and a lifetime is estimated.

Figure 12:
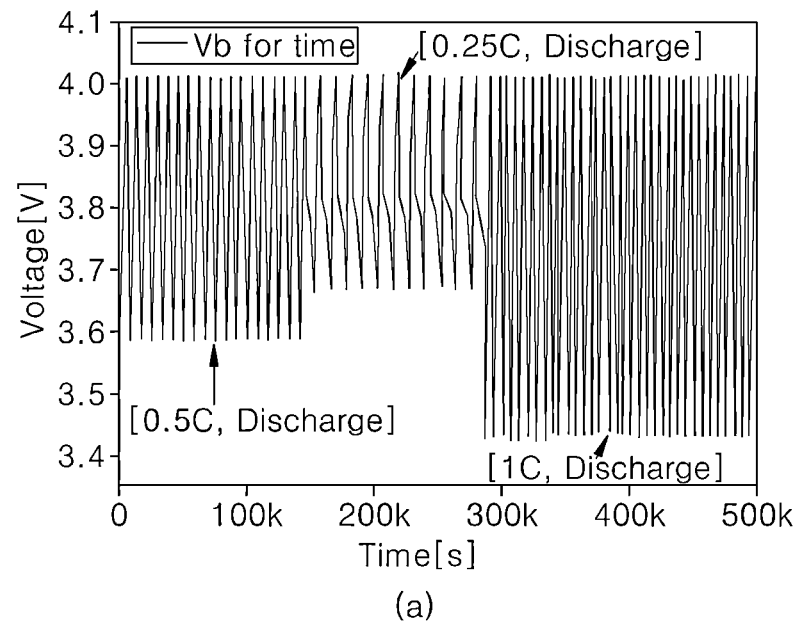
FIG. 12 shows comparison a voltage change based on time and a voltage change based on an SOC when a discharge current changes in real time.
Figure 12:
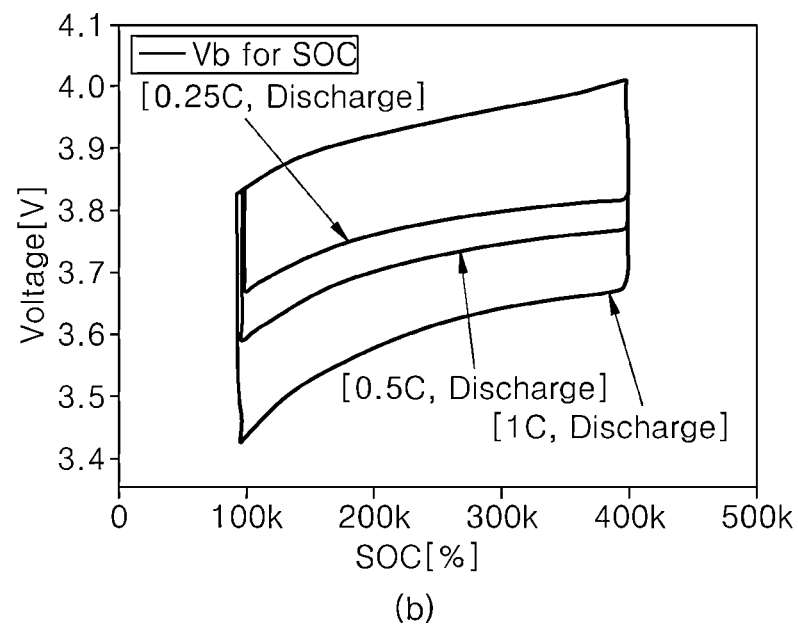

Result of lifetime cycle prediction FIG. 12 shows comparison between a voltage change based on time and a voltage change based on an SOC when a discharge current changes in real time. FIG. 12A shows changes of a voltage state when the magnitude of a discharge current changes to 0.5 C, 0.25 C, and 1 C for predetermined intervals. However, in FIG. 12B, although the discharge current changes at every time intervals, the voltage change graph for the SOC shows a constant cycle curve regardless of laps of time. Accordingly, it can be seen that it is very efficient to predict a lifetime using a voltage/SOC curve regardless of a change of a charge/discharge pattern of a user.

Table 3 shows the result of comparing a lifetime predicted by applying the method proposed by the present disclosure with the actual remaining capacity while the magnitude of the charge/discharge current of a battery and the DOD are changed.

TABLE 3

| Charging Current [C] | Discharging Current [C] | DOD[%] | Actual Cycle | Predicted Cycle | Accuracy Rate[%] |
|---|---|---|---|---|---|
| 0.5 | 1 | 100 [0-100] | 554.5 | 510 | 92.0 |
| 0.5 | 1 | 80 [10-90] | 704.0 | 650 | 92.4 |
| 0.5 | 1 | 70 [20-90] | 841.3 | 778 | 92.5 |
| 0.5 | 1 | 60 [20-80] | 983.1 | 918 | 93.4 |
| 0.5 | 1 | 50 [30-80] | 1,238.8 | 1,172 | 94.6 |
| 0.25 | 1 | 100 [0-100] | 583.1 | 538 | 92.2 |
| 0.25 | 1 | 80 [10-90] | 736.5 | 685 | 93.0 |
| 0.25 | 1 | 70 [20-90] | 879.3 | 815 | 92.7 |
| 0.25 | 1 | 60 [20-80] | 1,024.4 | 954 | 93.1 |
| 0.25 | 1 | 50 [30-80] | 1,290.8 | 1,218 | 94.4 |
| 0.1 | 1 | 100 [0-100] | 633.3 | 585 | 92.3 |
| 0.1 | 1 | 80 [10-90] | 795.3 | 740 | 93.1 |
| 0.1 | 1 | 70 [20-90] | 950.7 | 890 | 93.6 |
| 0.1 | 1 | 60 [20-80] | 1,099.3 | 1,031 | 93.8 |
| 0.1 | 1 | 50 [30-80] | 1,374.4 | 1,299 | 94.5 |
| 0.5 | 2 | 100 [0-100] | 381.0 | 350 | 91.8 |
| 0.5 | 2 | 80 [10-90] | 476.4 | 443 | 92.9 |
| 0.5 | 2 | 70 [20-90] | 568.6 | 532 | 93.5 |
| 0.5 | 2 | 60 [20-80] | 663.6 | 622 | 93.8 |
| 0.5 | 2 | 50 [30-80] | 837.4 | 787 | 94.0 |
| 0.5 | 0.5 | 100 [0-100] | 822.7 | 765 | 93.0 |
| 0.5 | 0.5 | 80 [10-90] | 1,045.2 | 979 | 93.7 |
| 0.5 | 0.5 | 70 [20-90] | 1,251.6 | 1,175 | 93.9 |
| 0.5 | 0.5 | 60 [20-80] | 1,459.6 | 1,376 | 94.3 |
| 0.5 | 0.5 | 50 [30-80] | 1,843.9 | 1,744 | 94.6 |
| 0.5 | 0.1 | 100 [0-100] | 2,078.5 | 1,933 | 93.0 |
| 0.5 | 0.1 | 80 [10-90] | 2,612.8 | 2,453 | 93.9 |
| 0.5 | 0.1 | 70 [20-90] | 3,120.3 | 2,936 | 94.1 |
| 0.5 | 0.1 | 60 [20-80] | 3,607.9 | 3,406 | 94.4 |
| 0.5 | 0.1 | 50 [30-80] | 4,553.7 | 4,308 | 94.6 |
| 1 | 2 | 100 [0-100] | 366.8 | 336 | 91.6 |
| 1 | 2 | 80 [10-90] | 452.3 | 418 | 92.4 |
| 1 | 2 | 70 [20-90] | 548.7 | 510 | 92.9 |
| 1 | 2 | 60 [20-80] | 640.9 | 597 | 93.1 |
| 1 | 2 | 50 [30-80] | 810.4 | 756 | 93.3 |

As a result, it can be seen that there is a slight difference in estimation accuracy depending on the DOD. The accuracy was slight low in the range of 0 to 100%, and the smaller the DOD, the smaller the estimation error and the higher the accuracy. It can be seen that the deviation in accuracy estimated in the section with a DOD of 100% and the section with a DOD of 50% was maximally 2.7%, but there was a deviation of about 1% depending on the magnitude of the charge/discharge current.

Conclusion

Figure 13:
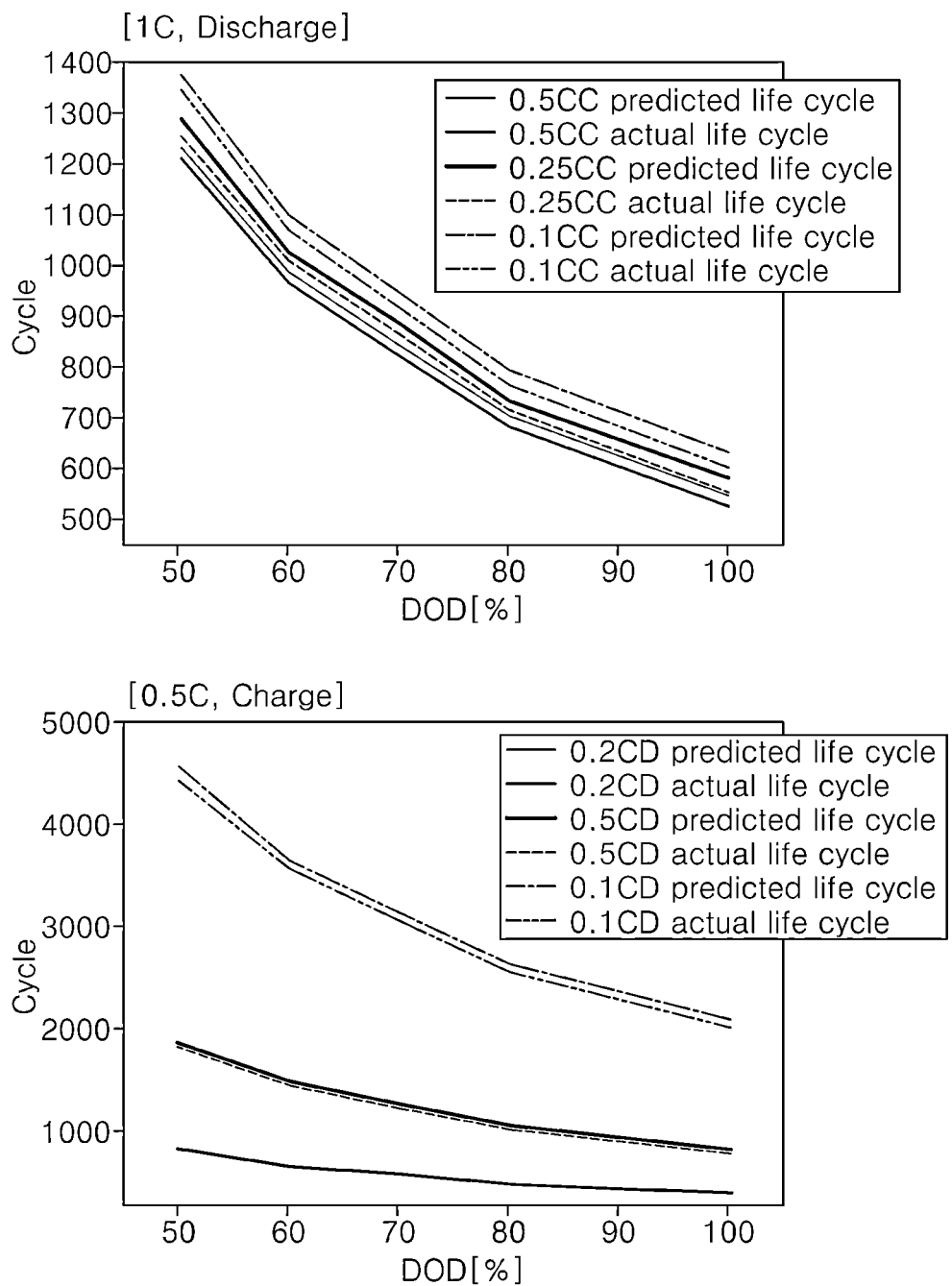
FIG. 13 is a comparative curve between a predicted lifetime and an actual lifetime.

FIG. 13 is a comparative curve between a predicted lifetime and an actual lifetime.

FIG. 13 shows the data of Table 1 in a graph. It can be seen that the remaining lifetime greatly depends on the charge/discharge C-rate and the DOD. The result of predicted lifetime was compared on the basis of the actual remaining capacity, and average accuracy over 93% was obtained by analyzing the predicted lifetime. The accuracy was slight low in the section with a high DOD, and the accuracy in a section with 20 to 80% and a section with 30 to 80%, that are expected as actual use sections, was 94%.

From this result, it can be seen that the DOD and the C-rate are most important for the lifetime. As can be seen from the analysis result of the curves for calculating irreversible heat capacity in the present disclosure, it can be seen that the area of the Q value clearly depends on the DOD and the C-rate.

Accordingly, the larger the DOD, the larger the C-rate and the larger the Q value, which means that the lifetime decreases. On the other hand, the irreversible heat capacity slightly increases, depending on the aged state of a battery, under the same conditions (the same DOD and C-rate), but the aging speed is relatively low in comparison to the effect of the DOD or the C-rate.

As the result of the test, it can be seen that the temperature has little influence on the result. When the temperature is out of an appropriate operation range, the calculated irreversible energy increases, which means the reduction of the lifetime. Similarly, as the battery is aged, the irreversible energy to be calculated increases. According to the present disclosure, the average expected lifetime is provided with accuracy of 90% or more, and temperature and the aged state should be considered in the $Q_{ir\_m}$ value in order to increase the accuracy.

By the present disclosure, an apparatus for predicting the lifetime of a lithium-ion battery that is widely used in accordance with entropy theory is provided, and the result was verified. The apparatus has the advantage that it can be implemented physically, but intuitively and relatively easily. As described above, there are many errors in the method of estimating and analyzing a lifetime accompanied by a function of temperature and time. Actually, it is more effective to estimate a lifetime from the information of high voltage and current with higher response than temperature when acquiring and processing a battery state in real time. The voltage considers the internal state, temperature, and environmental factors of the battery, which makes analysis easy.

Further, a voltage is used for SOC information without using a component that changes with time, whereby the influence on the time component that changes in accordance with a use pattern is removed. Further, it was verified from the test result according to the present disclosure that the present disclosure is valid and accurate with accuracy over 92%.

Although the present invention has been described with reference to the exemplary embodiments illustrated in the drawings, those are only examples and may be changed and modified into other equivalent exemplary embodiments from the present invention by those skilled in the art.

Further, the apparatus according to the present disclosure may be implemented by computer-readable codes in a computer-readable recording medium. A computer-readable recording medium includes all kinds of recording devices that store data that can be read by a computer system. The computer-readable recording medium, for example, may be a ROM, a RAM, a CD-ROM, a magnetic tape, a floppy disk, and an optical data storage device, and includes a carrier wave (for example, transmission through the Internet). Further, the computer-readable recording medium may store computer-readable codes that can be executed in a distributed manner by distributed computer systems that are connected through a network.

In the terms used herein, singular forms should be understood as including plural forms unless the context clearly indicates otherwise. It will be further understood that the terms "comprises", etc. are used to specify the presence of stated features, numbers, steps, operations, components, parts, or a combination thereof, but do not preclude the presence or addition of one or more other features, numbers, steps, operations, components, parts, or a combination thereof. Terms '-er', '-unit', '-module', '-block', etc. used herein mean the units for processing at least one function or operation and may be implemented by hardware, software, or a combination of hardware and software.

Accordingly, the embodiments and the accompanying drawings only clearly show some of the spirits included in the present disclosure. It is apparent that modifications and detailed embodiments that can be easily inferred by those skilled in the art within the scope of the present disclosure included in the specification and drawings are all included in the right range of the present disclosure.

INDUSTRIAL APPLICABILITY

The present disclosure can be applied to a battery management technology.

The invention claimed is:

1. A system for predicting a ratio of an actual number of times of cycles and a predicted number of times of cycles of a battery being chargeable and dischargeable using charge and discharge characteristics in a Battery Management System (BMS), the system comprising:
    a battery state measurement device comprising a first computer readable code in a first non-transitory computer-readable recording medium measuring a voltage, a State of Charge (SOC), and a Depth of Discharge (DOD) of the battery while charging and discharging the battery with changing charge current and discharge current;
    an irreversible energy amount deriving device comprising a second computer readable code in a second non-transitory computer-readable recording medium deriving an irreversible energy amount ($Q_{ir}$) that is generated when the battery is charged/discharged from the voltage and the SOC using enthalpy and entropy theory, wherein the total energy amount of the battery $Q_{total}$ is defined as the sum of irreversible joule heat $Q_{irreversible}$, reversible joule heat $Q_{reversible}$, and heat by terminal resistance $T_{tab}$ by the following equation, $$Q_{total} = Q_{irreversible} + Q_{reversible} + Q_{tab}$$

$$= I(E_{oc} - E_t) - IT\left(\frac{\partial E_{OC}}{\partial T}\right)_{SOC} + I^2(R_A(T) + R_S(T))$$

where, I is current, T is temperature, $R_A$ and $R_B$ are the resistances of terminal A and B, respectively, $E_{oc}$ is an open circuit voltage and $E_t$ is a voltage at time t; and
    a remaining lifetime prediction device comprising a third computer readable code in a third non-transitory computer-readable recording medium predicting a remaining lifetime of the battery from the derived irreversible energy amount ($Q_{ir}$),
    wherein the irreversible energy amount ($Q_{ir}$) is derived from the following equation:

$$\frac{Q_{ir}}{Q_0} = \int (\alpha E_C - E_D) dSOC$$

where $Q_0$ is a maximum capacity of the battery, $\alpha$ is an Arrhenius rate constant, and $E_C$ and $E_D$ are cell voltages at charge and discharge, respectively,
    wherein the ratio of the actual number of times of cycles and the predicted number of times of cycles, $N_a/N_p$ is predicted from the following equation:

$$\frac{\sum_{k=1}^{n} Q_{ir\_k}}{\min\left(mQ_{ir\_m} \cdot \sum_{k=1}^{n} Q_{ir\_k}\right)} = \frac{N_a}{N_p}$$

wherein $Q_{ir\_m}$ is a maximum value of the irreversible energy amount at each cycle, m is the maximum cycle period, $N_a$ and $N_p$ are the actual number of times of cycles and the predicted number of times of cycles, respectively, and $Q_{ir\_k}$ is the current irreversible energy amount at a k-th cycle.

2. The system of claim 1, wherein the remaining lifetime prediction device obtains $Q_{ir\_m}$ and $Q_{ir\_k}$ from the area of a charge and discharge curve at each cycle in a graph showing the relationship between the voltage and the SOC of the battery.

3. The system of claim 2, wherein the area of the charge and discharge curve at each cycle is obtained by dividing the charge and discharge curve into at least two or more sections and summing up areas of the divided sections.

4. The system of claim 3, wherein the dividing of the charge and discharge curve at each cycle includes:
    extracting charging start points ($P_{CS}$, $P^*_{CS}$), charging knee points ($P_CK$, $P^*_{CK}$), discharging start points ($P_{DS}$, $P^*_{DS}$), and discharging knee points ($P_{DK}$, $P^*_{DK}$) at two continuous cycles in the charge and discharge curve; and
    dividing the charge and discharge curve into: a first section formed by $P_{CS}$, $P^*_{CS}$, $P_{CK}$, and $P^*_{CK}$; a second section formed by $P_{CS}$, $P^*_{CK}$, $P^*_{DS}$, and $P^*_{DK}$; and a third section formed by $P_{DS}$, $P^*_{DS}$, $P_{DK}$, and $P^*_{DK}$.

5. The system of claim 4, wherein the charging start point ($P_{CS}$) and the discharging start point ($P_{DS}$) are extracted by a change of a current direction, and the charging knee point ($P_{CK}$) and the discharging knee point ($P_{DK}$) are extracted on the basis of the amount of a change of voltage for the SOC.

* * * * *